United States Patent
Yokozeki (10) Patent No.: US 6,556,472 B2
(45) Date of Patent: Apr. 29, 2003

(54) STATIC RAM WITH OPTIMIZED TIMING OF DRIVING CONTROL SIGNAL FOR SENSE AMPLIFIER

(75) Inventor: Wataru Yokozeki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/038,827

(22) Filed: Jan. 8, 2002

(65) Prior Publication Data

US 2002/0186579 A1 Dec. 12, 2002

(30) Foreign Application Priority Data

Jun. 12, 2001 (JP) ........................................ 2001-177049

(51) Int. Cl.[7] .............................................. G11C 11/00
(52) U.S. Cl. .................... 365/154; 365/156; 365/210
(58) Field of Search ................... 365/154, 156, 365/210

(56) References Cited

U.S. PATENT DOCUMENTS 6,282,133 B1 * 8/2001 Nakagawa et al. ......... 365/154
6,490,214 B2 * 12/2002 Kawasumi .................. 365/210

FOREIGN PATENT DOCUMENTS

| JP | A-6-349280 | 12/1994 |
| JP | A-11-203873 | 7/1999 |

* cited by examiner

Primary Examiner—Huan Hoang
(74) Attorney, Agent, or Firm—Arent Fox Kintner Plotkin & Kahn, PLLC (57) ABSTRACT

The present invention is a static RAM comprising a memory cell array having memory cells located at intersections of word lines and bit lines, and a sense amplifier for amplifying a voltage of the bit lines; this static RAM further comprising: dummy memory cells selected when the word line is selected; a dummy bit line connected to the dummy memory cells; a timing signal generating circuit for generating a timing control signal in response to a change in potential of the dummy bit line; and a dummy memory cell selecting circuit for, in response to a selection of a word line in a word line group including a plurality of the word lines, selecting the dummy memory cell shared by the word line group.

15 Claims, 10 Drawing Sheets

STATIC RAM WITH OPTIMIZED TIMING OF DRIVING CONTROL SIGNAL FOR SENSE AMPLIFIER

BACKGROUND OF THE INVENTION

1. Field of the Invention

The present invention relates to a static RAM, and more particularly to a clock-synchronized SRAM with optimized timing of a driving control signal such as for the sense amplifier.

2. Description of the Related Art

Static RAM (hereinafter "SRAM") comprises a latch circuit having cross-connected CMOS inverters in the memory cell and is a high-speed semiconductor memory which can retain stored data so long as power is applied. Data is continuously held by the latch circuit of the memory cell, making unnecessary periodic refresh operations such as in DRAM. Clock-synchronized SRAM is one of the types of high-speed SRAM developed in recent years. In this clock-synchronized SRAM, the address and control signal are supplied in synchronization with a clock, the internal circuitry operates according to the timing of the clock, and data are output after a prescribed access time from the supply of the clock.

Non-clock-synchronized SRAM does not have the clock supplied from outside, and instead, the internal circuitry is started upon the detection of a change of the input address.

The internal operations of SRAM are generally as follows. First, in the clock-synchronized type, an address input in synchronization with a clock is decoded and a word line is driven. With the driving of the word line, the memory cell drives a bit line and the voltage difference developed between bit lines is amplified by the sense amplifier. The data amplified by the sense amplifier are then output from the output buffer. When the reading operation is complete, the bit line pair and sense amplifier output pair are short circuited and precharged to the power supply voltage.

All of the operations above are controlled by a timing control signal generated by a timing control circuit. In particular, the sense amplifier enable signal is preferably generated at the shortest time after the bit line is driven by the memory cell and the prescribed voltage difference is developed between bit lines. The driving capability of the memory cell varies according to the process variation. Accordingly, the sense amplifier control signal is generated with a sufficient timing margin from the activation of the word line. Even if the driving capability of the memory cell varies into lower and the time at which the prescribed potential difference is developed between bit lines is delayed, the sense amplifier does not operate in error due to this timing margin.

The high-speed characteristics of SRAM are lost when sufficient margin is established in the timing of the bit line enable signal as discussed above. A proposed method for resolving this problem is a self-timing system wherein a dummy circuit, with a word line, memory cells, and bit lines, is provided and the sense amplifier enable signal is generated using this dummy circuit.

Figure 1:
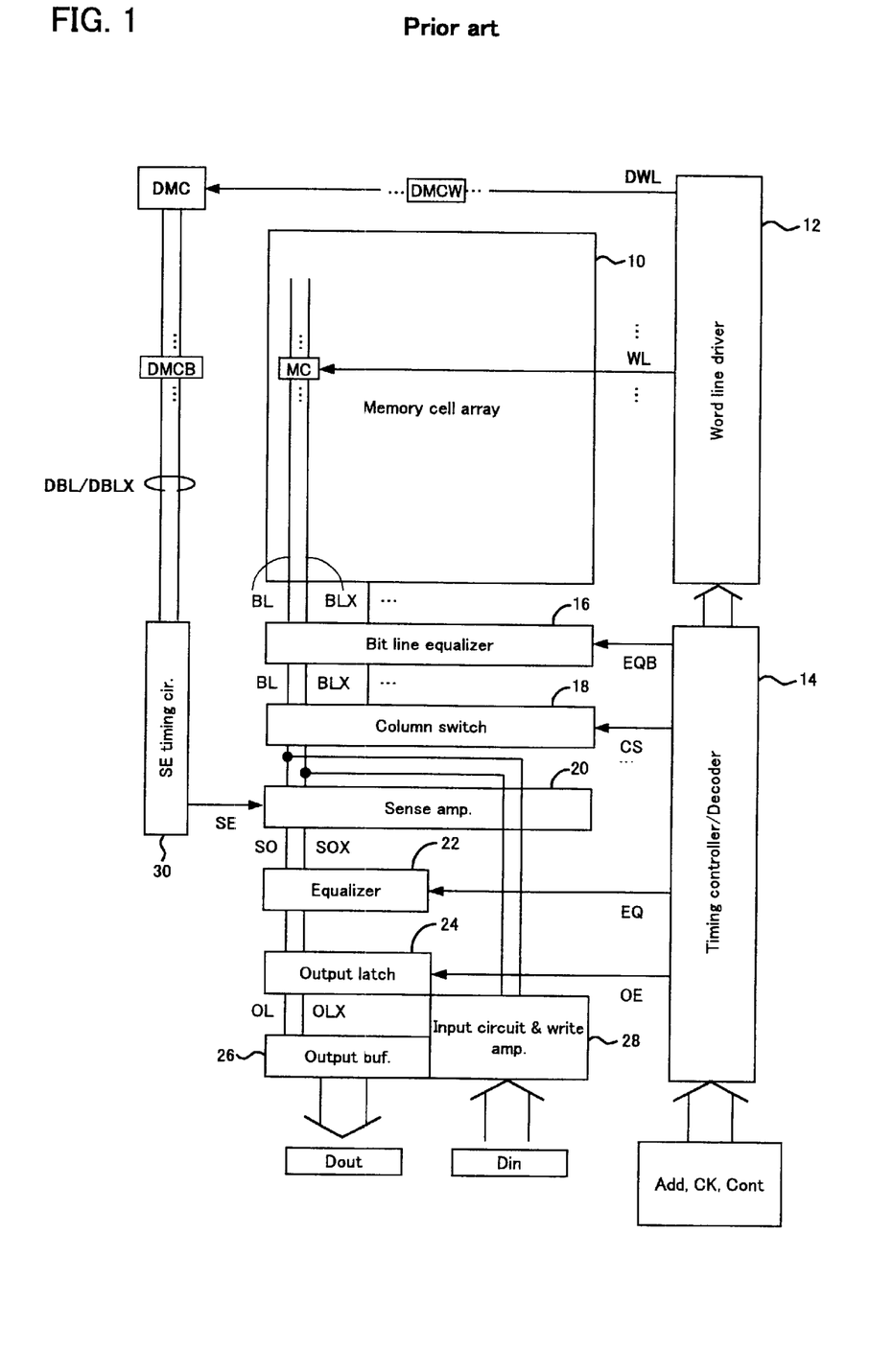
FIG. 1 shows a schematic of conventional SRAM using a dummy circuit.

FIG. 1 shows a schematic of conventional SRAM using such a dummy circuit. In this example, the address Add and control signal Cont input in synchronization with the clock CK are decoded by the timing control circuit and decoder circuit 14, and the timing signals EQB, CS, EQ, and OE are generated. The word line WL selected by the decoder circuit is driven by the word line driver 12 and selects a memory cell MC in the memory cell array 10. In response thereto, the memory cell MC drives the bit line pair BL, BLX and the bit line pair selected by the column switch 18 is amplified by the sense amplifier 20. The sense amplifier output SO, SOX is latched by the output latch circuit 24 at the time of the output enable signal OE and output to the output buffer 26 through the output lines OL, OLX, and the output data Dout are generated. After that, the bit line pair is short circuited by the bit line equalizing circuit 16 at the time of the bit line equalizing signal EQB and precharged to the power source voltage. In the same way, the sense amplifier output So, SOX is also short circuited and precharged at the time of the equalizing signal EQ. When writing, the input data Din is input to the input circuit and write amplifier 28, and the selected bit line pair is driven from the write amplifier.

In this prior art, a dummy word line DWL is provided separately from the word line WL in the memory cell array 10; the dummy memory cells DMC are provided separately from the regular memory cells MC, and the dummy bit line pair DBL, DBLX is provided separately from the regular bit line pair BL, BLX. A loading dummy cell DMCW is provided on the dummy word line DWL and a loading dummy cell DMCB is provided on the dummy bit line pair DBL, DBLX. Accordingly, the dummy word line DWL is driven when the regular word line WL is driven and, at the time when the prescribed voltage difference is generated across the regular bit line pair, the same voltage difference is generated across the dummy bit line pair DBL, DBLX. Consequently, the SE timing circuit 30 generates the sense amplifier enable signal SE in response to the voltage difference on the dummy bit line pair DBL, DBLX and can thereby start the sense amplifier 20 at the optimum timing.

Even when the driving capability of the memory cell varies because of the process variation, the sense amplifier enable signal SE can be generated at the optimum timing corresponding to those process variation because the same variation occur in the dummy memory cell DMC.

A problem of the prior art discussed above is that since the dummy circuit, comprising a dummy word line DWL, a dummy memory cell DMC, and dummy bit line pair DBL, DBLX, is accessed each cycle, the reliability of transistors and wiring in the dummy circuit is lower than that of the regular circuit, comprising a word line, memory cells, and bit line pair. For example, if there are 512 word lines WL in the memory cell array 10, the probability that a regular word line WL will be operating is 1/512. On the other hand, because the dummy word line DWL is accessed each cycle, the probability of the driving operation is 1. The dummy word line is driven at a high frequency and consequently, the transfer gate transistors in the dummy memory cell controlled by the dummy word line is controlled in a conductive state every cycle by the driving of the dummy word line. Because of this control, the transfer gate transistors have decreased its driving capability because of hot carrier deterioration and the like so that the timing of the sense amplifier enable signal SE generated by the dummy circuit will be delayed.

Furthermore, the prior art discussed above results in greatly increased power consumption because the dummy circuit operates every cycle and the dummy word line is driven separately from the regular word line. In effect, during normal operations, the regular word line WL is driven along with the dummy word line DWL, and as a result the power consumption increases.

Figure 2:
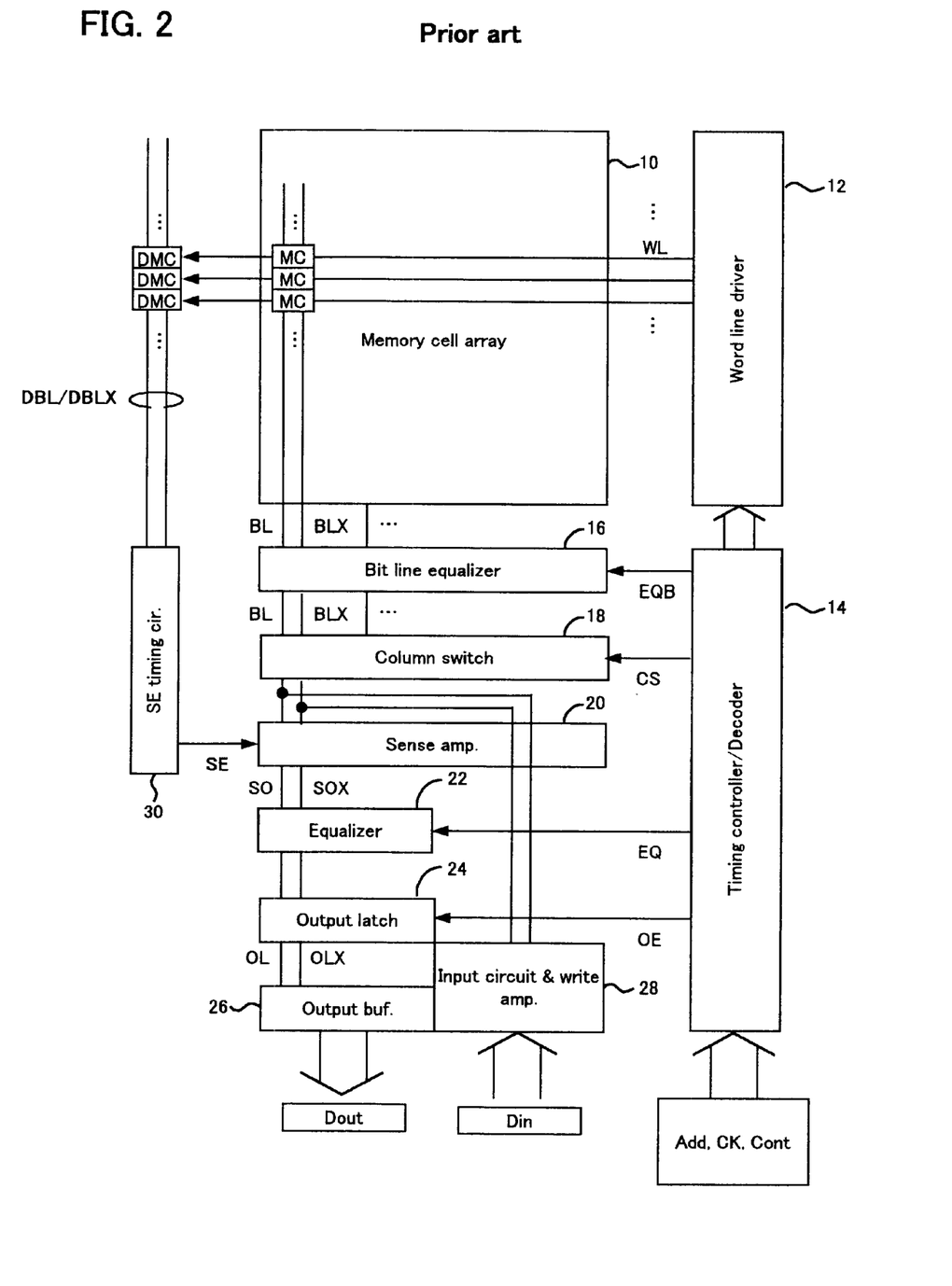
FIG. 2 is a schematic of conventional SRAM using a different dummy circuit.

FIG. 2 shows the constitution of another conventional SRAM using a dummy circuit. The same reference numbers are used as in FIG. 1. In this prior art, a dummy word line is not provided and all the regular word lines WL are connected to the dummy memory cells DMC provided on the left side of the memory cell array 10. Consequently, the dummy memory cells DMC are positioned along the dummy bit lines DBL, DBLX and are disposed in the same way as the regular memory cells MC.

Because the dummy word line is omitted from this example, the increase in power consumption can be suppressed by a corresponding degree. Moreover, the decrease in reliability can be prevented because the dummy memory cells DMC are not accessed every cycle.

However, because every word line is connected to a dummy memory cell, the dummy memory cells DMC must be provided at the same pitch as the regular memory cells MC. Even if the dummy bit line pair DBL, DBLX is driven by a plurality of dummy memory cells DMC, the driving operation cannot be made faster than that of the regular bit line pair BL, BLX and it becomes difficult to provide optimum timing of the sense amplifier enable signal SE. In effect, in order to generate the sense amplifier enable signal SE at the optimum time, the change in voltage of the dummy bit line pair supplied to the SE timing circuit is preferably made somewhat faster than the change in voltage of the regular bit line pair. In order to make the operation of the dummy bit line pair faster than that of the regular bit line pair, the driving capability of the dummy memory cell must be made greater than that of the regular memory cell. However, such a constitution is difficult in the example in FIG. 2 where dummy memory cells DMC are provided to every word lines WL.

Adding the dummy memory cells DMC in a direction parallel to the word lines WL was considered as a countermeasure, but the load capacity of the dummy bit line pair becomes higher with such positioning and such high speeds cannot be achieved.

SUMMARY OF THE INVENTION

It is therefore an object of the present invention to provide SRAM having a dummy circuit which can generate a control signal at the optimum timing and has low power consumption.

It is another object of the present invention to provide SRAM having a dummy circuit which can make small adjustments to the timing of the control signal and generate a control signal at the optimum timing corresponding to a process variation.

In order to achieve the abovementioned objects, one aspect of the present invention is a static RAM comprising a memory cell array having memory cells located at intersections of word lines and bit lines, and a sense amplifier for amplifying a voltage of the bit lines; this static RAM further comprising: dummy memory cells selected when the word line is selected; a dummy bit line connected to the dummy memory cells; a timing signal generating circuit for generating a timing control signal in response to a change in potential of the dummy bit line; and a dummy memory cell selecting circuit for, in response to a selection of a word line in a word line group including a plurality of the word lines, selecting the dummy memory cell shared by the word line group.

In the abovementioned invention, the plural word lines in the word line group share the dummy memory cell and the corresponding dummy memory cell is selected in response to the selection of any word line in the word line group. When selected, the dummy memory cell drives the dummy bit lines and causes the potential thereon to change. The timing signal generating circuit at least generates a sense amplifier enable signal for starting the sense amplifier in response to the change in potential of the dummy bit lines. As a result, first of all, the dummy word line can be omitted and the increase in power consumption therefore can be suppressed. In the second place, having a shared dummy memory cell for a plurality of word lines makes it possible for a plurality of dummy memory cells to be selected at the same time and to generate the sense amplifier enable signal at the optimum time.

In a more preferable embodiment of the abovementioned invention, the dummy memory cells have the same dimension as the regular memory cells and are connected in parallel to the dummy bit lines. Furthermore, a dummy cell unit is constituted by a plurality of dummy memory cells and the dummy memory cells associated with the dummy cell unit are selected at the same time. Because the plurality of dummy memory cells is selected at the same time according to the above structure, the dummy bit lines can be driven at a high driving capability and consequently the change in potential of the dummy bit lines can be made faster than for the regular bit lines. Consequently, the timing signal generating circuit can generate the sense amplifier enable signal at more appropriate timing. Moreover, the dummy memory cells can be realized in a layout identical to that of the regular memory cells.

In a more preferable embodiment of the abovementioned invention, the dummy memory cell comprises a latch circuit having two cross-connected inverters, with one of a pair of nodes of the latch circuit being connected to a high level or low level power source. With such a structure, the driving direction of the dummy bit line pair by the dummy memory cells is always the same direction and the structure of the timing signal generating circuit can be simplified. In particular, when a plurality of dummy memory cells in a dummy cell unit are selected at the same time, one of the pair of nodes of the latch circuit in the dummy memory cells is connected to the same level power source and therefore, the driving directions of the dummy bit line pair at the time of selection are all same. The competitive operation among the plurality of simultaneously selected dummy memory cells is thereby prevented.

In a more preferable embodiment of the abovementioned invention, the plurality of word lines provided in the memory cell array are divided into a plurality of word line groups and a plurality of dummy memory cell selecting circuits are provided for the word line groups respectively. By having a plurality of dummy memory cell selecting circuits in this way, it becomes possible to reduce the number of word lines input to each of the dummy memory cell selecting circuits and the scale of the dummy memory cell selecting circuits can be kept small.

In a more preferable embodiment of the abovementioned invention, a dummy cell unit setting circuit is provided for variably setting the number of dummy memory cells associated with the dummy memory cell unit. First of all, this dummy cell unit setting circuit has a structure wherein the number of dummy memory cells in a single dummy memory cell unit can be set variably by a control signal from outside. As an another structure, the number of dummy memory cells can be set variably by a storage signal of ROM disconnectable by a laser beam or the like. As further another structure, the number of dummy memory cells can be set variably by a metal option through the mask pattern of the wiring layer.

In order to achieve the abovementioned objects, another aspect of the present invention is a static RAM wherein an address is supplied in synchronization with a clock; this static RAM comprising: a memory cell array having memory cells located at intersections of word lines and bit lines; a sense amplifier for amplifying a voltage of the bit lines; dummy memory cells selected when the word line is selected; a dummy bit line connected to the dummy memory cells; a timing signal generating circuit for generating a timing control signal in response to a change in potential of the dummy bit line; and a dummy memory cell selecting circuit for inputting a word line group including a plurality of the word lines and selecting the dummy memory cell shared by the word line group in response to a selection of at least one of the word lines in the word line group.

In order to achieve the abovementioned objects, another aspect of the present invention is a static RAM wherein an address is supplied in synchronization with a clock and the operation cycle is controlled by the clock; this static RAM comprising: a memory cell array having memory cells located at intersections of word lines and bit lines; a sense amplifier for amplifying a voltage of the bit lines in response to a sense amplifier enable signal; a plurality of dummy memory cells aligned with the memory cell array and disposed in the direction of the bit lines; a dummy bit line connected in parallel to the plurality of dummy memory cells; a timing signal generating circuit for generating the sense amplifier enable signal in response to a change in potential of the dummy bit line; and a dummy memory cell selecting circuit for selecting a plurality of the dummy memory cells at the same time in response to the selection of the word line.

DESCRIPTION OF THE PREFERRED EMBODIMENTS

The embodiments of the present invention are explained below with reference to the drawings. The scope of the present invention is not limited by the following embodiments and includes inventions described in the claims and equivalents thereto.

Figure 3:
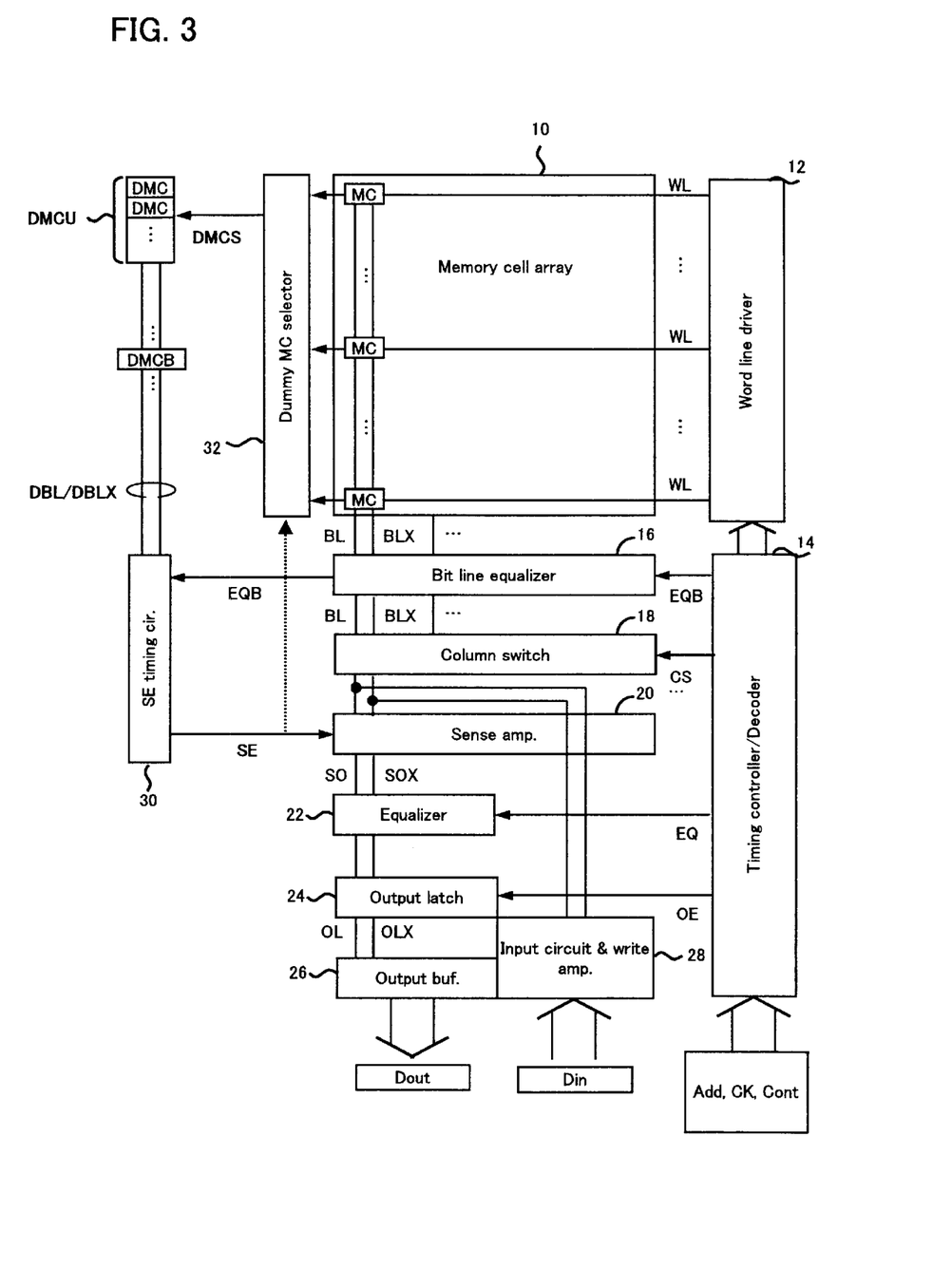
FIG. 3 is a schematic of SRAM relating to the first embodiment.

FIG. 3 is a schematic of SRAM relating to the first embodiment. This SRAM includes a memory cell array 10 comprising a plurality of word lines WL and a plurality of bit line pairs BL, BLX, and memory cells MC disposed in a matrix at the intersections of those lines. Although not shown, the memory cells MC contain six transistors to form two cross-connected CMOS inverters to be a latch circuit. One pair of nodes of the latch circuit are connected to the bit line pair through two transfer gate transistors. Furthermore, the gates of the transfer gate transistors are connected to the word line WL.

As explained in the prior art, a synchronized SRAM has an address Add and control signal Cont supplied in synchronization with a clock CK. In response thereto, a decoder circuit 14 decodes the row address and supplies a selecting signal to the word line driver 12. Also, the decoder circuit 14 decodes the column address and generates a column selecting signal CS. The word line driver 12 drives the corresponding word line WL in response to the selecting signal. With the driving of the word line, the memory cell MC connected to the selected word line is selected, the transfer gate transistors thereof become conductive, and the bit line pair BL, BLX is driven by the latch circuit in the selected memory cell. Accordingly, a certain potential difference is generated between the bit line pair.

The column switch 18 is selected by the column selecting signal CS and the corresponding bit line pair is connected to the sense amplifier 20. The sense amplifier 20, in response to the sense amplifier enable signal SE generated by the timing signal generating circuit 30, amplifies the voltage of the bit line pair BL, BLX. The output pair SO, SOX of the sense amplifier 20 is latched by the output latch circuit 24 in response to the output enable signal OE generated by the timing control circuit 14, and the output latch signals OL, OLX are supplied to the output buffer 26. Thereafter, the output buffer 26 outputs the output data Dout.

Once a series of read operations is finished, the bit line equalizing circuit 16 short circuits the bit line pair in response to the bit line equalizing signal EQB and precharges the bit lines to a power source voltage level. Likewise, the equalizing circuit 22 equalizes the potential of the sense amplifier output lines SO, SOX in response to the equalizing signal EQ.

In the first embodiment in FIG. 3, the dummy memory cells DMC are provided on the left side of the memory cell array 10 along the dummy bit lines DBL, DBLX with the same layout as the regular memory cells MC. The dummy memory cell selecting circuit 32 inputs the plurality of word lines WL and outputs a dummy memory cell selecting signal DMCS in response to the selection of any of the word lines from that plurality of word lines. A dummy memory cell DMC is selected in response to the dummy memory cell selecting signal DMCS. Consequently, a dummy memory cell is shared by a plurality of word lines.

Moreover, the dummy cell unit DMCU selected by the dummy memory cell selecting signal DMCS includes a plurality of dummy memory cells DMC. Also, a plurality of word lines WL share the dummy memory cell unit. In effect, these dummy memory cells DMC are disposed in the same layout as the regular memory cells, but a plurality of dummy memory cells can be selected at the same time.

In this way, the dummy cell unit DMCU comprises a plurality of dummy memory cells DMC. And the dummy bit line pair DBL, DBLX can be driven in parallel by the plurality of dummy memory cells by selecting those dummy memory cells at the same time. Consequently, the dummy cell unit DMCU has a higher driving capability than that of the regular memory cells MC and can make the change in potential of the dummy bit line pair faster than the change in potential of the regular bit line pair.

Along the above, the SE timing circuit 30, for generating the sense amplifier enable signal SE, can generate the sense amplifier enable signal SE at an optimum timing with some margin. Consequently, the number of dummy memory cells DMC in the dummy cell unit may be any number with which the abovementioned operation can be realized. It is desirable that the number of dummy memory cells be set variably according to design specifications. Also, loading dummy memory cells DMCB may be provided on the dummy bit line pair DBL, DBLX and the number of those loading dummy memory cells may be adjusted according to the number of dummy memory cells in the dummy cell unit so that the load capacity provided to the dummy bit line pair is designed to be about the same as that of the regular bit line pair.

In the first embodiment, the dummy memory cell selecting circuit 32 is a logical sum circuit inputting word lines WL. A logical sum circuit is usually constituted by a plurality of NOR gates and a single NAND gate having as its input the output of the NOR gates. The constitution of this logical sum circuit is discussed below.

In the abovementioned first embodiment, when any of the word lines WL in the memory cell array 10 is selected and driven, the dummy memory cell selecting circuit 32 generates a dummy memory cell selecting signal DMCS and selects a plurality of dummy memory cells DMC in the dummy cell unit DMCU. Accordingly, the dummy bit line pair DBL, DBLX is driven and the SE timing circuit 30, in response to the change in potential thereon, generates the sense amplifier enable signal SE. This SE timing circuit 30 is a timing control signal generating circuit of the invention.

Figure 4:
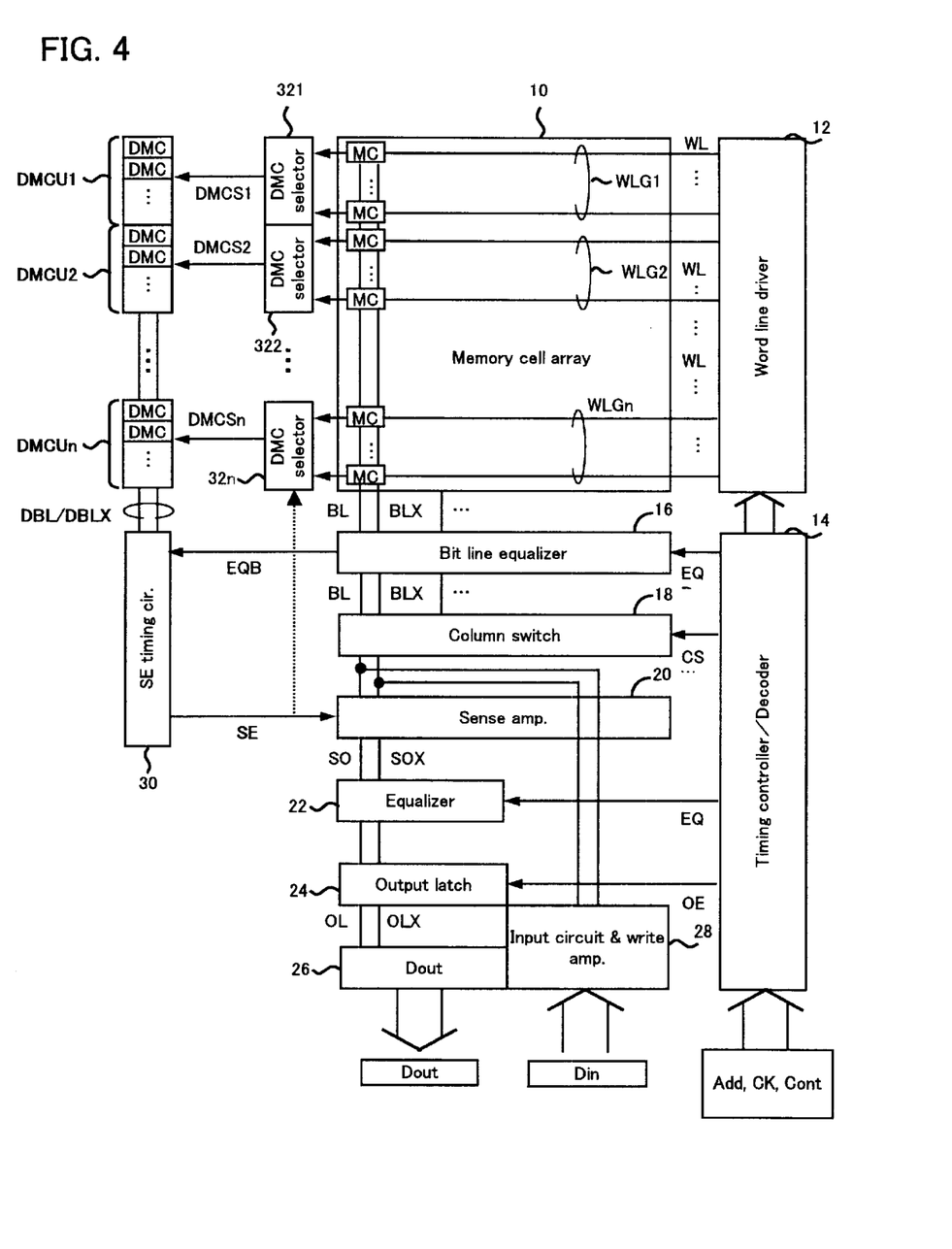
FIG. 4 is a schematic of SRAM relating to the second embodiment.

FIG. 4 is a schematic of SRAM relating to the second embodiment. The same reference numbers are used for portions identical to those in FIG. 3. In the first embodiment, a single dummy cell unit DMCU was provided for all the word lines WL in the memory cell array. With such a constitution, however, the number of inputs to the dummy memory cell selecting circuit becomes large and the circuit becomes large in scale. A large scale circuit results in a decrease in the per-element efficiency of the circuit and brings on delays of the dummy memory cell selecting signal. Also, the frequency of selection of the dummy memory cells DMC becomes high and this results in deteriorating reliability.

In the second embodiment, therefore, the word lines WL in the memory cell array 10 are divided into a plurality of word line groups WLG1 through n, and dummy memory cell selecting circuits 321 through 32n and dummy cell units DMCU1 through n are provided for each word line group WLGL through n. For example, if 512 word lines WL are provided in the memory cell array 10, word line groups WLG are provided for each eight word lines WL. Accordingly, the word line groups WLG, dummy memory cell selecting circuits 321-n, and dummy cell units DMCU are 512/8=64(=n) in number. The dummy memory cell selecting circuit becomes a logical sum circuit inputting eight word lines WL and will be a small scale circuit. Also, the dummy cell unit DMCU comprises eight dummy memory cells DMC as a maximum.

In the abovementioned constitution, when one of the word lines WL in the word line group WLGL is selected, the dummy memory cell selecting circuit 321 outputs a selecting signal DMCS1 and selects the plurality of dummy memory cells DMC associated with the dummy cell unit DMCU1 at the same time. Accordingly, the dummy bit line pair DBL, DBLX is driven by the plurality of dummy memory cells and the change in potential thereon is propagated to the SE timing circuit 30.

Figure 5:
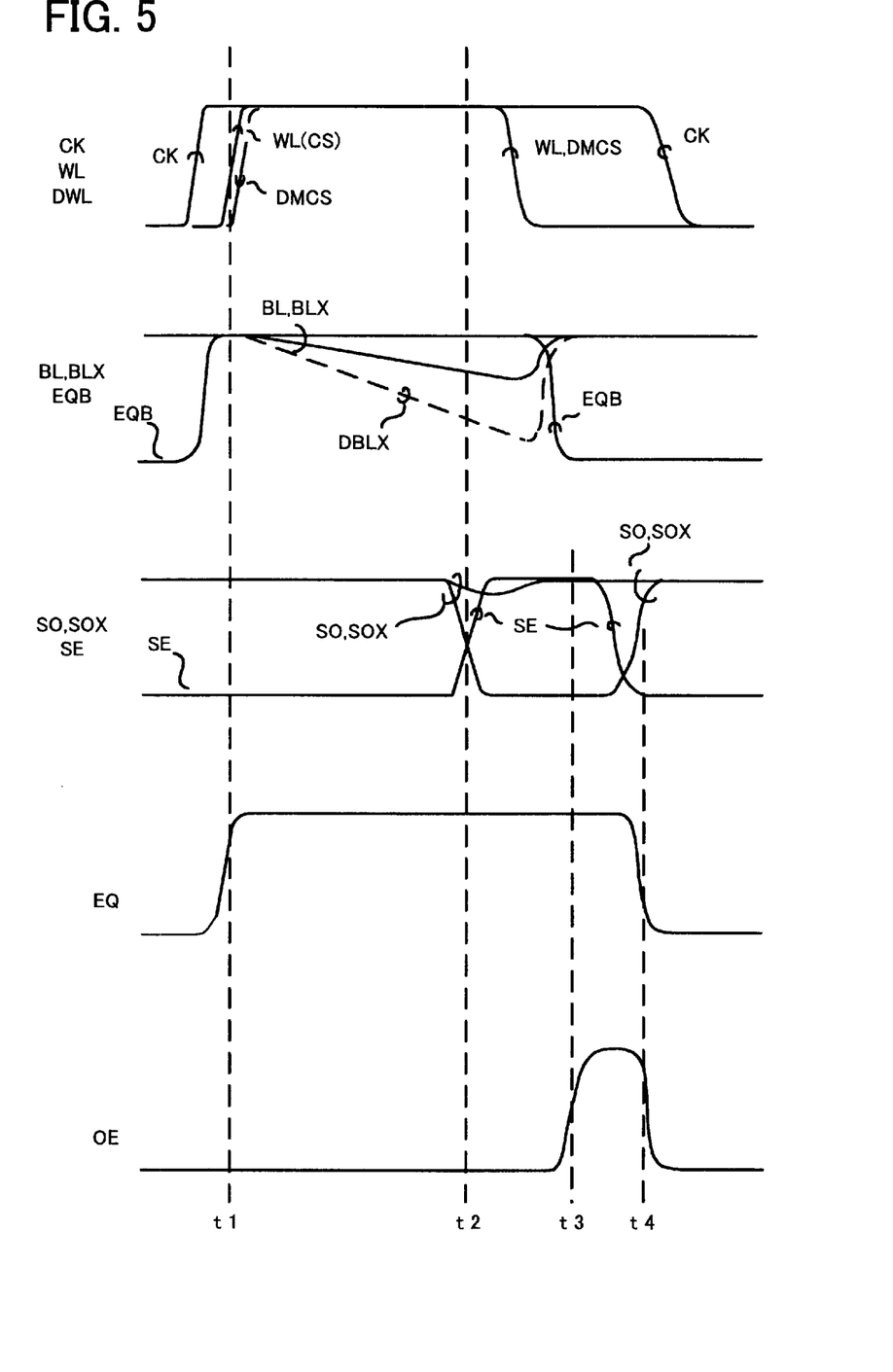
FIG. 5 is the operation timing chart for the SRAM relating to the first and second embodiments.

FIG. 5 is the operation timing chart for the SRAM relating to the first and second embodiments. In a synchronized SRAM, a single operation cycle is from the rise to the fall of the clock CK. Initially, the address Add and control signal Cont, not shown, are supplied in synchronization with the rise of the clock CK. The word line WL is driven at the time t1 following the timing of this clock CK. At the same time, a column selecting signal CS is also generated.

With the driving of the word line WL, the corresponding dummy memory cell selecting circuit 32i (i=1, 2, 3 . . . ) generates the dummy memory cell selecting signal DMCS and selects the corresponding dummy cell unit DMCU.

With the driving of the word line WL, the bit line pair BL, BLX is driven by the memory cell MC. The bit line pair BL, BLX is precharged to the source potential in a reset state and the latch circuit in the memory cell connected according to the driving of the word line draws down the potential of one bit line. Likewise, according to the dummy memory cell selecting signal DMCS, the plurality of dummy memory cells DMC in the dummy cell unit drive down the dummy bit line DBLX. Because the dummy bit line DBLX is driven by a plurality of dummy memory cells at this time, the change in potential thereon is faster than that of the regular bit line.

In response to the change in potential on the dummy bit line pair, the SE timing circuit 30 generates the sense amplifier enable signal SE at the time t2. In response to this sense amplifier enable signal SE, the sense amplifier 20 amplifies the potential difference of the selected bit line pair and draws one of the sense amplifier output pair SO, SOX down to low level. Because of the circuit structure of the sense amplifier, it is sometimes the case that the input of the bit line pair becomes the output without being changed. In that case, the bit line pair is also amplified to a large amplitude. In the example in FIG. 5, however, the potential itself of the bit line pair is not amplified.

In due course, the signals of the sense amplifier output pair SO, SOX are latched by the output latch circuit 24 at time t3 in response to the output enable signal OE generated by the timing control signal circuit 14. The equalizing signal EQ is then generated at time t4 and the sense amplifier output pair SO, SOX are precharged to high level and reset. Also, in response to the bit line equalizing signal EQB, the bit line pair BL, BLX is also precharged to high level and reset. Furthermore, a dummy bit line equalizing circuit is contained within the SE timing circuit 30 and in response to the bit line equalizing signal EQB, the dummy bit pair DBL, DBLX are also precharged to high level and reset.

Figure 6A:
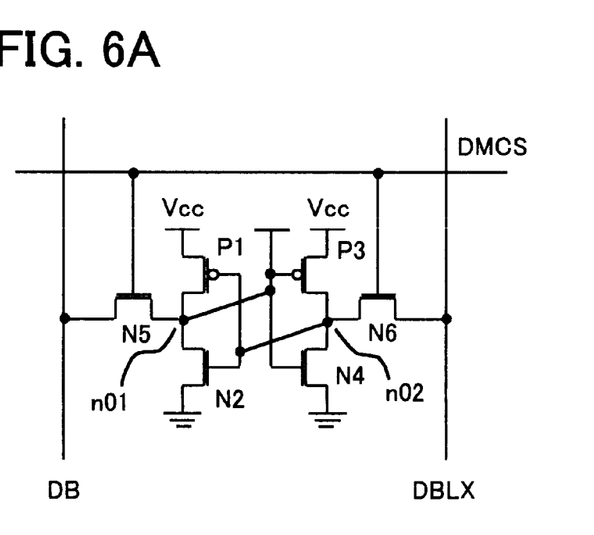
FIGS. 6A & 6B show circuit diagrams of dummy memory cells relating to the embodiment.
Figure 6B:
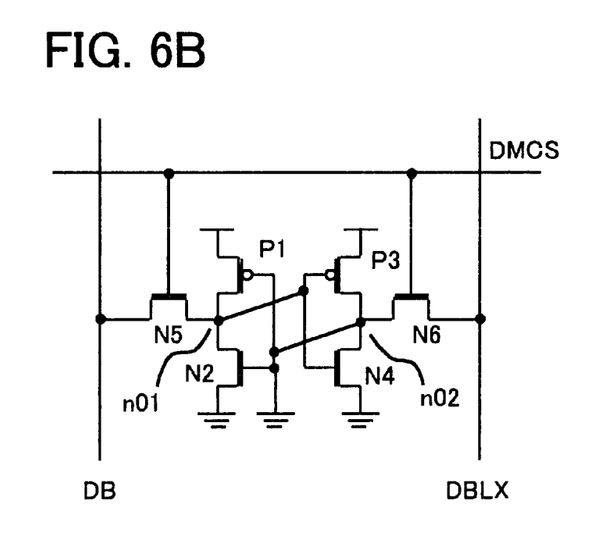

FIG. 6 shows circuit diagrams of dummy memory cells relating to the embodiments. The dummy memory cells drive a dummy bit line pair in response to a selecting signal in the same way as the regular memory cells to provide a timing corresponding to the driving capability of the regular memory cells to the SE timing circuit 30. Consequently, a function for storing data is not necessary. Instead, in the present embodiment, it is desirable that the driving operation be set in the same direction in order to avoid competition among the dummy memory cells, because a plurality of dummy memory cells DMC in the dummy cell unit is selected at the same time and drives the dummy bit line pair in parallel.

The dummy memory cells in the present embodiment therefore have one of one pair of nodes in the latch circuit connected to the power supply voltage Vcc or ground.

FIG. 6 shows two types of dummy memory cells. The dummy memory cell in FIG. 6A has a first inverter, constituted by a P channel transistor P1 and an N channel transistor N2, and a second inverter constituted by transistors P3, N4 whose the inputs and outputs are cross-connected and constituting a latch circuit. Furthermore, one pair of nodes n01, n02 of the latch circuit is connected through the transfer gate transistors N5, N6 to the dummy bit line pair DBL, DBLX. Also, the gates of the transistors N5, N6 are connected to the dummy memory cell selecting signal DMCS. The constitution up to this point is the same as that of a regular memory cell. In the dummy memory cell, one node n01 of the pair of nodes n01, n02 of the latch circuit is connected to the power source voltage Vcc. The node n01 of the latch circuit is continuously maintained at high level and the node n02 at low level.

In a dummy memory cell with such a constitution, the dummy bit line DBLX will always be drawn down to low level when the transistors N5, N6 are made conductive by the selecting signal DMCS.

On the other hand, the dummy memory cell in FIG. 6B is the same regarding the four transistors P1, N2, P3, N4 and the transfer gate transistors N5, N6 constituting a latch circuit, and the node n02 in the pair of nodes in the latch circuits is connected to ground. Consequently, when the transistors N5, N6 become conductive due to the selecting signal DMCS, the dummy bit line DBL will always be drawn down to low level.

As noted above, fixing the bit line driving operation of the dummy memory cell in one direction prevents competition for the dummy bit line driving operation among dummy memory cells when a plurality of dummy memory cells DMC is selected at the same time. Also, the constitution of the SE timing circuit 30 can be simplified because the same dummy bit line is continually driven at low level.

The dummy memory cells may have either constitution as shown in FIG. 6, but the constitution in FIG. 6A, where one node is fixed at high level is preferable. The reason for this is as follows: the bit line pair and dummy bit line pair are set at high level (power source voltage level) in the reset state and the bit line corresponding to the low level side node is drawn down with the selection of the memory cell. In that case, at the instant when the transfer gate transistor opens, the load capacity of the bit line and the capacity of the node in the memory cell are connected together and the potential of the low level side node rises temporarily due to the coupling operation.

Consequently, in the dummy memory cell as well, fixing one node to high level rather than ground can repeat the temporary rising action of the low level side and an operation similar to an actual memory cell can be realized.

Figure 7:
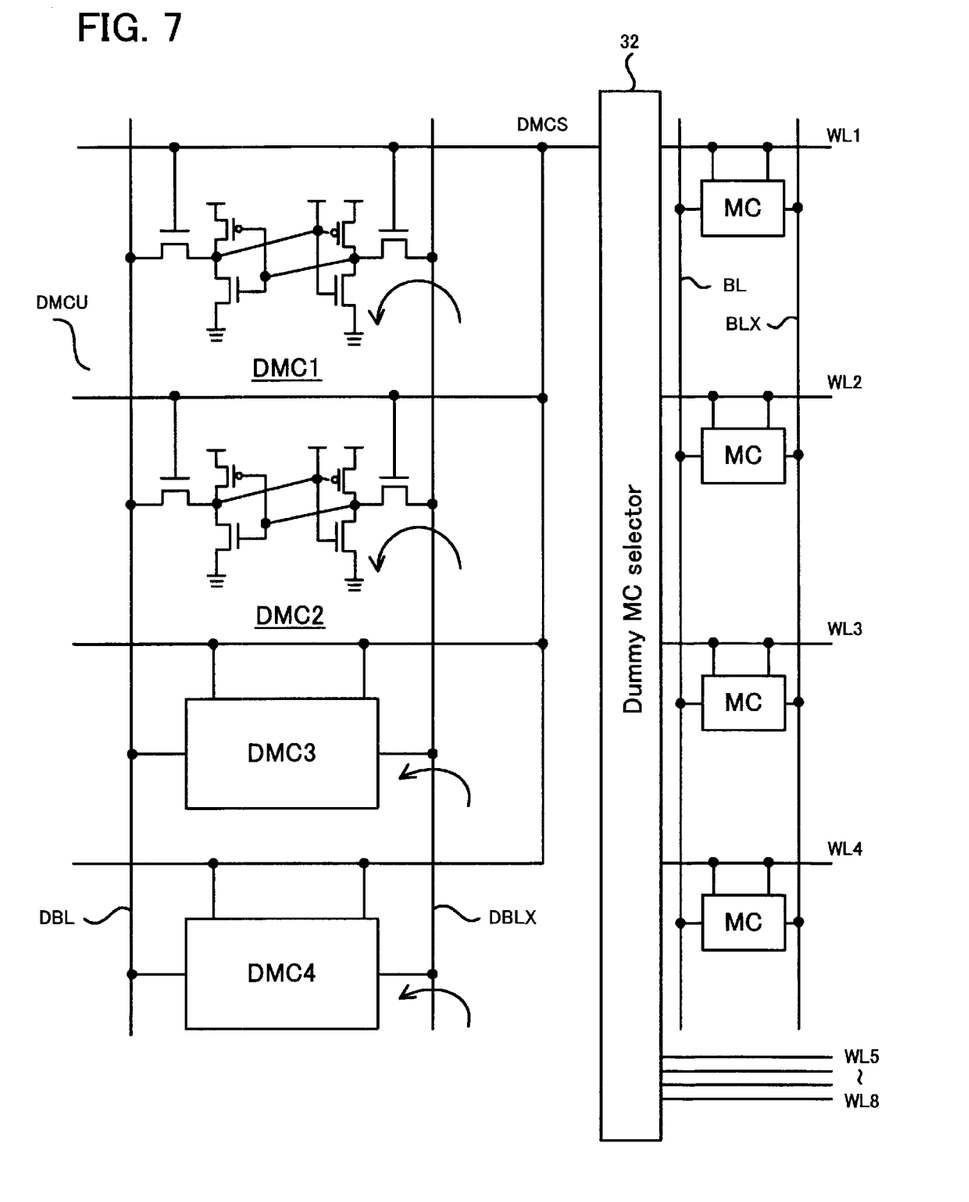
FIG. 7 is a circuit diagram showing the dummy memory cells and regular memory cells relating to the embodiments.

FIG. 7 is a circuit diagram showing the dummy memory cell and regular memory cell relating to the present embodiment. In FIG. 7, a dummy cell unit DMCU comprising four dummy memory cells DMC1 through DMC4 is provided for eight word lines WL1 through WL8. Consequently, a word line group is formed of the eight word lines WL1 through WL8 and those are inputs to the dummy memory cell selecting circuit 32. When any of the word lines in the word line group is selected, the dummy memory cell selecting signal DMCS is driven at high level and the four dummy memory cells DMCU1 through 4 in the dummy cell unit DMCU are selected at the same time and drive the dummy bit line DBLX in parallel at low level.

The dummy memory cell DMC shown in FIG. 7 is the type shown in FIG. 6A and one node in the latch circuit is connected to the power source voltage. Consequently, the four dummy memory cells DMC1 through 4 drive the dummy bit line DBLX to the low level side at the same time. As a result, the dummy bit line DBLX is driven to the low level side more quickly than the bit line driving by the regular memory cells. This means that the timing of the sense amplifier enable signal SE generated by the SE timing circuit 30 can be matched to the timing of the voltage change in the regular bit line pair. Moreover, the four dummy memory cells effect the driving operation in the same direction simultaneously and therefore there is no competition for the operation among dummy memory cells.

Figure 8A:
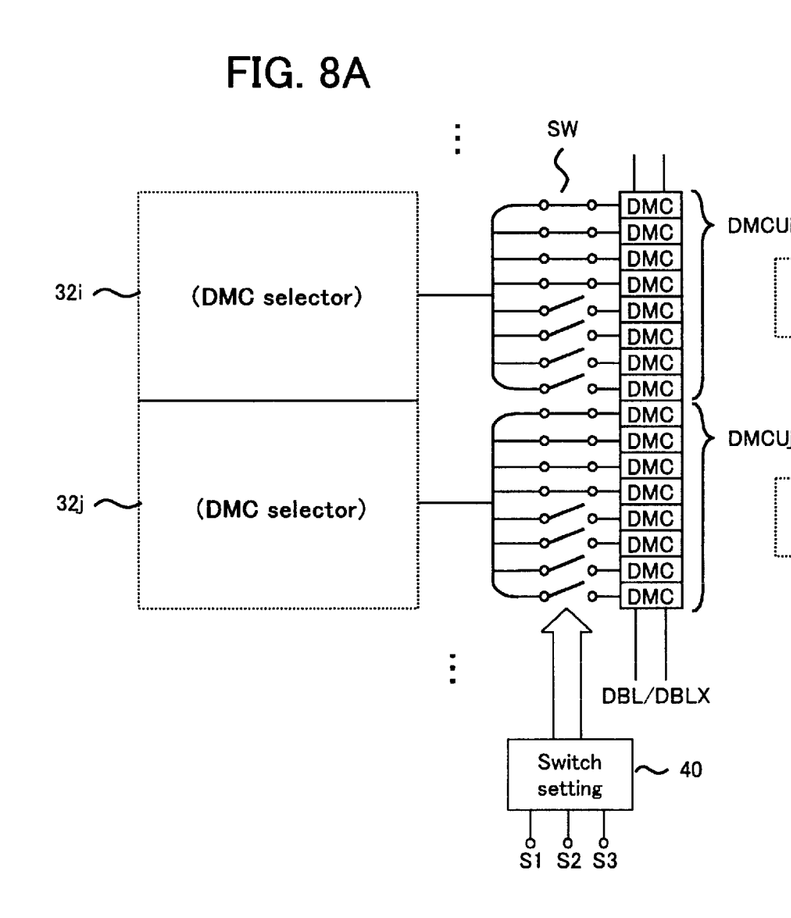
FIGS. 8A & 8B are drawing to explain a modification of the second embodiment.

FIG. 8 is a drawing to explain a modification of the second embodiment. In this modification, the number of dummy memory cells in the dummy cell unit can be set variably. For this reason, as shown in FIG. 8A, switch groups SW are provided between the dummy memory cell selecting circuits 32i, 32j and the dummy memory cells DMC. Those switch groups SW are constituted to be able to be set variably by the switch setting circuit 40. In other words, the dummy cell unit setting circuit is constituted by the switch groups and switch setting circuit.

Figure 8B:
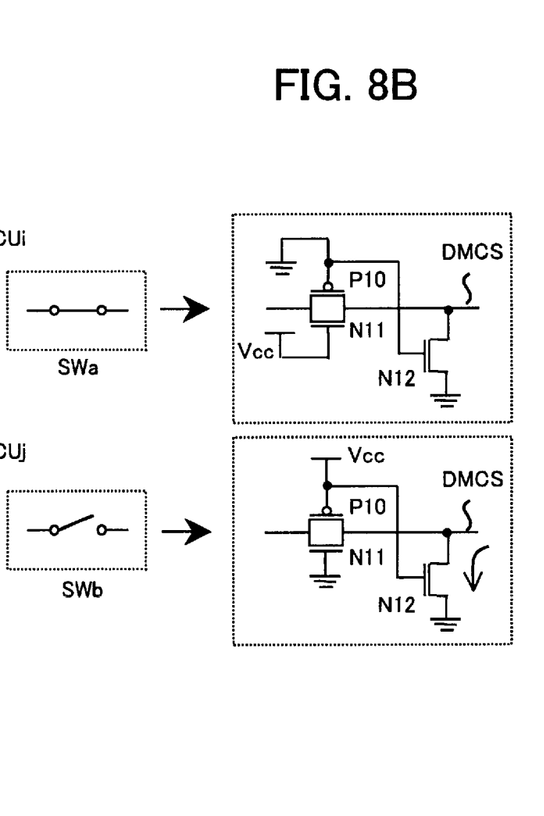

Also, as shown in FIG. 8B, when switches in the switch groups SW are in the conductive state SWa, the gates of one pair of transfer transistors P10, N11 are connected to ground and the power source Vcc respectively and the gate of the clamp transistor N12 is connected to ground. As a result, the clamp transistor N12 is turned off and the transfer transistors P10, N11 enter the conductive state. As a result, the output of the selecting circuit 32 is transmitted to the dummy memory cell DMC without being changed.

Meanwhile, when the switches are in the non-conductive state SWb, the gates of the pair of transfer transistors P10, N11 are connected to the source Vcc and ground respectively, and the gate of the clamp transistor N12 is connected to the power source Vcc. As a result, the clamp transistor N12 is turned on, the selecting signal DMCS is clamped at low level, and the transfer transistors P10, N11 enter the non-conductive state.

The states of the switch groups SW can be set variably. The switch setting circuit 40 supplies ground or power source voltage to the gates of the three transistors constituting each switch group SW. Three bit setting signals S1 through S3 are supplied to the switch setting circuit 40, these are decoded, the number of set switches is put in the SWa state and the remaining switches are put in the SWb state. In the sample in FIG. 8, four of the eight switches in the switch group are set to the conductive state SWa and the remaining four are set to the non-conductive state SWb. As a result, four of the eight dummy memory cells in the dummy cell unit are selected at the same time.

Variably setting the abovementioned setting signals S1 through S3 makes it possible to variably set the number of switches in the conductive state. The setting signals S1 through S3 can be supplied as a control signal from outside or can be set by fuse ROM, not shown. The number of dummy memory cells can also be set according to a mask option using mask data for the wiring pattern for each production lot.

The number of dummy memory cells in the dummy cell unit is selected appropriately for the design specifications. With many dummy memory cells, the driving capability of the dummy bit line pair becomes high and the voltage change to the SE timing circuit 30 can be made more quickly. On the other hand, with few dummy memory cells, the timing becomes slower. Consequently, the optimum number of dummy memory cells is selected according to the constitution of the SE timing circuit 30 and other design specifications.

When the present embodiment is set to the optimum number of dummy memory cells, even in the event of changes in the drive capability of the memory cells due to a process variation, the same variations are produced by the dummy memory cells and the timing of the sense amplifier enable signal SE can remain optimized.

Figure 9:
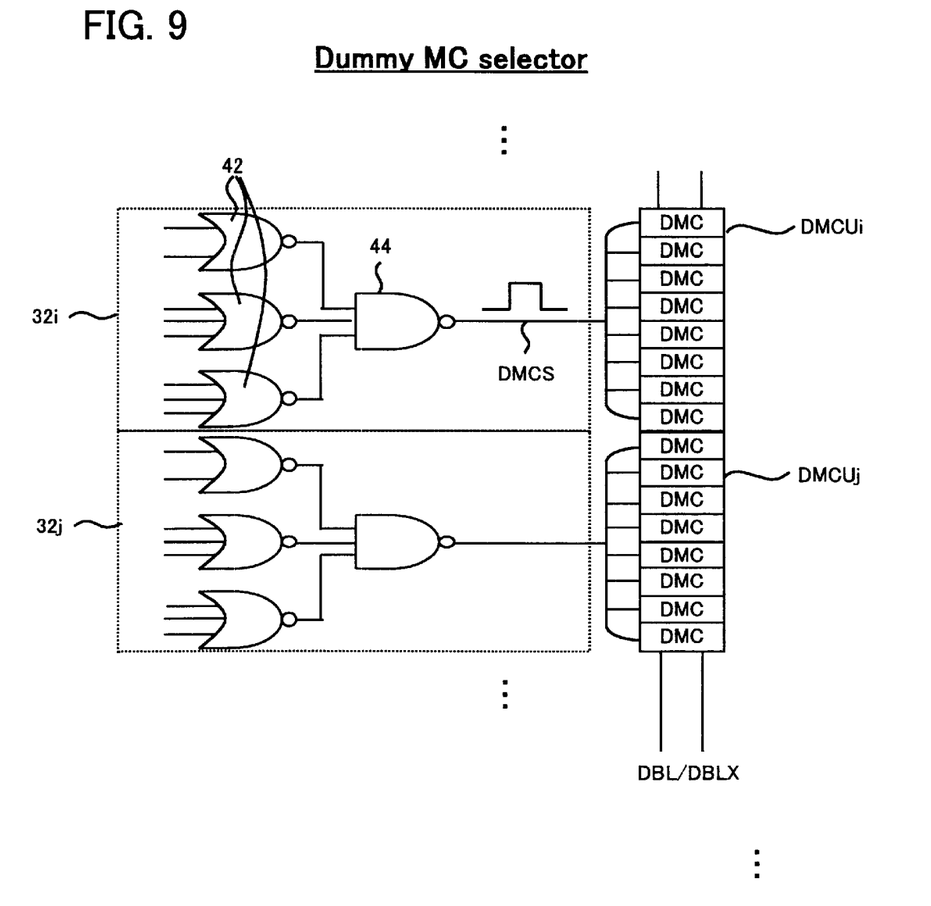
FIG. 9 is a circuit diagram of the dummy memory cell selecting circuit relating to the second embodiment.

FIG. 9 is a circuit diagram of the dummy memory cell selecting circuit relating to the second embodiment. The selecting circuit 32 in FIG. 9 is a static type logical sum circuit and is constituted by regular CMOS NOR gates 42 and a NAND gate 44. Two, three, and three of the eight word lines are input to the three NOR gates 42 and the output thereof is input to the NAND gate 44. In the static type logical sum circuit, the output of the NAND gate 44 becomes high level if any of its input becomes high level, and the output of the NAND gate 44 becomes low level if all of its input becomes low level. Consequently, the dummy memory cell selecting signal DMCS is controlled in the same way as the regular word line waveform.

Figure 10:
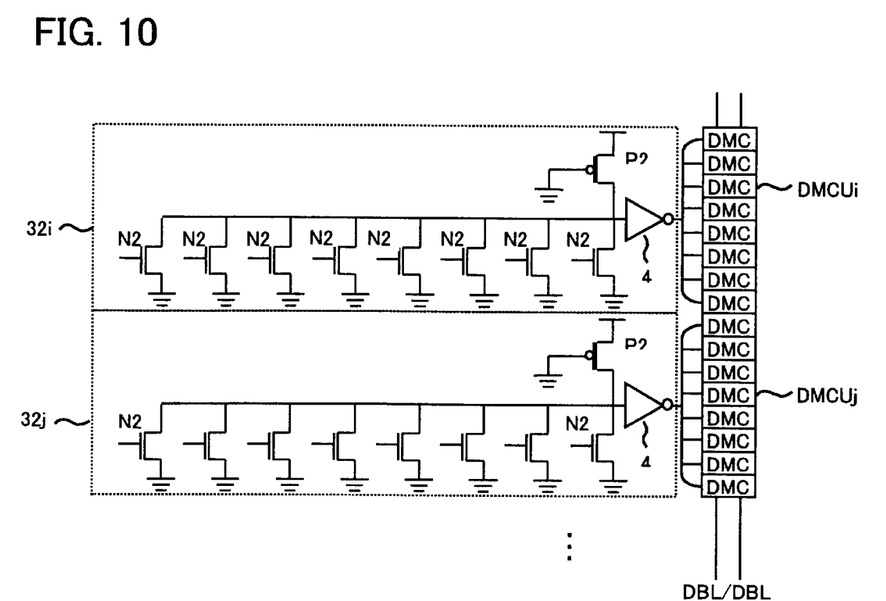
FIG. 10 is a circuit diagram of the dummy memory cell selecting circuit relating to the second embodiment.

FIG. 10 is another circuit diagram of the dummy memory cell selecting circuit relating to the second embodiment. This selecting circuit 32 comprises one loading P channel transistor P20, eight input N channel transistors N21 through N28, and an inverter 46. A word line WL is input to each of the eight input transistors N21 through N28. When any word line becomes high level, the input transistor becomes conductive and the input of the inverter 46 becomes low level. Accordingly, the inverter 46 outputs high level as the selecting signal. When all the word lines becomes low level, the input of the inverter 46 returns to high level and the output selecting signal becomes low level. Consequently, this circuit also generates a selecting signal with the same waveform as the driving waveform of the eight word lines.

Figure 11:
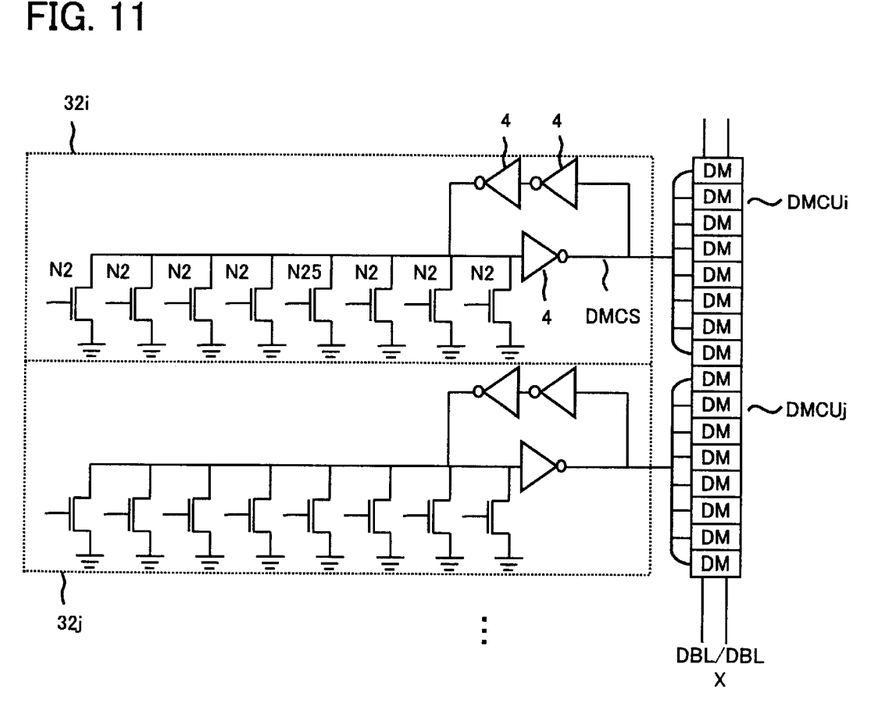
FIG. 11 is a circuit diagram of the dummy memory cell selecting circuit debating to the second embodiment.

FIG. 11 is another circuit diagram of the dummy memory cell selecting circuit relating to the second embodiment. This selecting circuit 32 is an improvement of FIG. 10 and includes a feedback buffer comprising a pair of the inverters 47, 48 for feeding back the output of the inverter 46 instead of the loading P channel transistor P20. Thereby, the input of the inverter 46 returns a high level of DMCS with the propagation delay time of the pair of inverters 47, 48 after the output of the inverter 46 rises to high level. Meanwhile, the output of the inverter 46 returns to low level. Consequently, the inverter 46 responds to a rise of any of the input word lines and outputs a high level pulse having the pulse width during the propagation delay time of the inverters 47, 48. Consequently, the pulse width of the selecting signal DMCS output by the inverter 46 can be set arbitrarily and independently of the driving waveform of the regular word lines.

A self-timing circuit for generating a sense amplifier enable signal at the optimum time, using a dummy circuit comprising dummy memory cells and a dummy bit line pair, was explained in the embodiments above. However, the present invention is not limited thereto and may also generate other control signals such as a bit line equalizing signal EQB, a sense amplifier output equalizing signal EQ, or an output enable signal OE for the output latch circuit.

An example of the present invention applied to clock-synchronized SRAM was explained in the abovementioned embodiments, but the present invention can also be applied to non-clock-synchronized SRAM. In the case of non-clock-synchronized SRAM, the clock is not supplied from outside. Instead, an ATD circuit for detecting a change in the address supplied from outside is established, the operation of the internal circuitry is started, and various timing signals for the internal circuitry are generated at the time when the start of a new read operation is detected with that ATD circuit. Consequently, in FIGS. 3 and 4, a detection circuit for detecting a change in the abovementioned address is provided in the timing control circuit/decoder circuit 14 and the output of the detection circuit has the same function as the clock. Also, in case of a write operation, the write operation is started when the write enable signal is activated and the write data are input. Otherwise, the constitution of the self-timing circuit with the dummy circuit are the same as in the clock-synchronized type.

According to the above embodiment, since a plurality of dummy memory cells can be selected at the same time by the regular word line which is actually driven, it becomes possible to generate a control signal at the optimum time for the regular bit line operations and with low power consumption.

With this invention, since the dummy memory cells in the dummy circuit for generating the timing control signal are driven by the regular word lines, a great increase in power consumption can be suppressed. Also, since dummy memory cells are provided for a plurality of word lines, a number of dummy memory cells selected at the same time can be plural and the dummy bit lines can be driven at high speeds. Accordingly, the control signal can be generated at the optimum timing.

What is claimed is:

1. A static RAM comprising:
   a memory cell array having memory cells located at intersections of word lines and bit lines;
   a sense amplifier for amplifying a voltage of said bit lines;
   dummy memory cells selected when said word line is selected;
   a dummy bit line connected to the dummy memory cells;
   a timing signal generating circuit for generating a timing control signal in response to a change in potential of said dummy bit line; and
   a dummy memory cell selecting circuit for inputting a word line group including a plurality of said word lines and selecting said dummy memory cell shared by the word line group in response to a selection of at least one of the word lines in said word line group.

2. The static RAM, according to claim 1, wherein a clock is supplied from outside and an address is supplied in synchronization with said clock.

3. The static RAM, according to claim 1, wherein said timing control signal includes a sense amplifier enable signal for enabling said sense amplifier.

4. The static RAM, according to claim 1, wherein said dummy memory cells are provided at the same pitch as the memory cells in the memory cell array; a dummy cell unit is composed of a plurality of the dummy memory cells; and said dummy memory cell selecting circuit selects a plurality of dummy memory cells in said dummy cell unit at the same time.

5. The static RAM, according to claim 4, wherein said dummy memory cells are located along dummy bit line and the plurality of dummy memory cells in said dummy cell unit are selected at the same time so as to drive the dummy bit line in parallel.

6. The static RAM, according to claim 1 or 4, wherein each of said dummy memory cells each comprises a latch circuit having two cross-connected inverters, and one of a pair of nodes in the latch circuits are connected to a high level or low level power source.

7. The static RAM, according to claim 1, wherein said memory cell array has a plurality of word line groups; and a dummy memory cell selecting circuit and dummy cell unit are provided for each of said word line groups.

8. The static RAM, according to claim 7, wherein the plurality of dummy memory cells in said dummy cell unit are selected at the same time and drive the dummy bit line in parallel.

9. The static RAM, according to claim 1, wherein a dummy cell unit setting circuit is provided between said dummy memory cell selecting circuit and said dummy memory cells, for variably setting the number of dummy memory cells belonging to said dummy cell unit.

10. The static RAM, according to claim 9, wherein said dummy cell unit setting circuit comprises:
 a switch group for propagating or not propagating a dummy memory cell selecting signal output by said dummy memory cell selecting circuit to said dummy memory cells; and
 a switch setting circuit for placing part or all of said switch group in a propagating state.

11. A static RAM comprising:
 a memory cell array having memory cells located at intersections of word lines and bit lines;
 a sense amplifier for amplifying a voltage of said bit lines in response to a sense amplifier enable signal;
 a plurality of dummy memory cells aligned with said memory cell array and disposed in the direction of the bit lines;
 a dummy bit line connected in parallel to the plurality of dummy memory cells;
 a timing signal generating circuit for generating said sense amplifier enable signal in response to a change in potential of said dummy bit line; and
 a dummy memory cell selecting circuit for selecting a plurality of the dummy memory cells in response to the selection of said word line.

12. The static RAM, according to claim 11, wherein a clock is supplied from outside, an address is supplied in synchronization with said clock, and the operation cycle is controlled by said clock.

13. The static RAM, according to claim 11, wherein the word lines in said memory cell array are divided into word line groups each including a plurality of word lines, and said dummy memory cell selecting circuit is provided for each of the word line groups.

14. The static RAM, according to claim 13, wherein a dummy cell unit is composed of a plurality of the dummy memory cells selected at the same time;
 said dummy cell unit is provided for each of said word line groups; and
 said dummy cell unit is selected by said dummy memory cell selecting circuit.

15. The static RAM, according to claim 11, wherein each of said dummy memory cells comprises a latch circuit having two cross-connected inverters, and one of a pair of nodes in the latch circuits are connected to a high level or low level power source.

* * * * *